Oct. 11, 1960 D. MEYERHOFER 2,956,217
SEMICONDUCTOR DEVICES AND METHODS OF MAKING THEM
Filed Nov. 20, 1958

INVENTOR.
DIETRICH MEYERHOFER
BY
W.S. Hill
AGENT

United States Patent Office 2,956,217

Patented Oct. 11, 1960

2,956,217

SEMICONDUCTOR DEVICES AND METHODS OF MAKING THEM

Dietrich Meyerhofer, Princeton, N.J., assignor to Radio Corporation of America, a corporation of Delaware Filed Nov. 20, 1958, Ser. No. 775,209

17 Claims. (Cl. 317—235)

This invention relates to improved semiconductor devices. More particularly, the invention relates to improved devices utilizing compound semiconductive materials, and to improved methods of making such devices.

In the art of making semiconductor circuit elements such as diodes and transistors, the semiconductive materials most often used are elemental germanium and silicon. Certain binary solid compounds also exhibit useful semiconductive properties. These materials are known as III–V compounds because they are made of one element from the third column and one element from the fifth column of the periodic table. Examples of such compounds are the phosphides, arsenides and antimonides of aluminum, gallium and indium. The III–V compounds have some advantages over conventional materials such as germanium and silicon: for example, the mobility of negative charge carriers is usually much greater in most of these compounds than in germanium or silicon. However, it has been found difficult to fabricate satisfactory devices such as diodes and transistors, utilizing these compound materials. One of the problems in the manufacture of junction type semiconductor devices from III–V compounds is the difficulty of making good PN junctions or rectifying barriers in wafers of these materials. The fabrication of good rectifying contacts to these materials is particularly difficult in the case of devices which must be capable of operation at high temperatures.

An object of this invention is to provide improved semiconductive devices utilizing compound semiconductors.

Another object of this invention is to provide improved circuit elements utilizing III–V compounds.

A further object is to provide improved methods of fabricating III–V compound semiconductor devices.

Still another object is to provide improved rectifying contacts for semiconductive devices made of III–V compounds.

A further object is to provide improved methods of introducing rectifying barriers in III–V compound semiconductor bodies.

Yet another object of this invention is to provide improved types of semiconductor devices for high temperature operation, having improved rectifying electrodes.

These and other objects of the invention are accomplished by alloying a pellet of electrode material selected from the group consisting of tin telluride and mixtures of tin telluride with tin to a surface of a monocrystalline semiconductive III–V compound wafer of P-conductivity type. It has unexpectedly been found that tin telluride makes an excellent rectifying contact to all P-conductivity type wafers of these materials. If desired, the ductility and mechanical strength of the electrode may be increased by using a mixture of tin telluride with tin.

Figure 1:
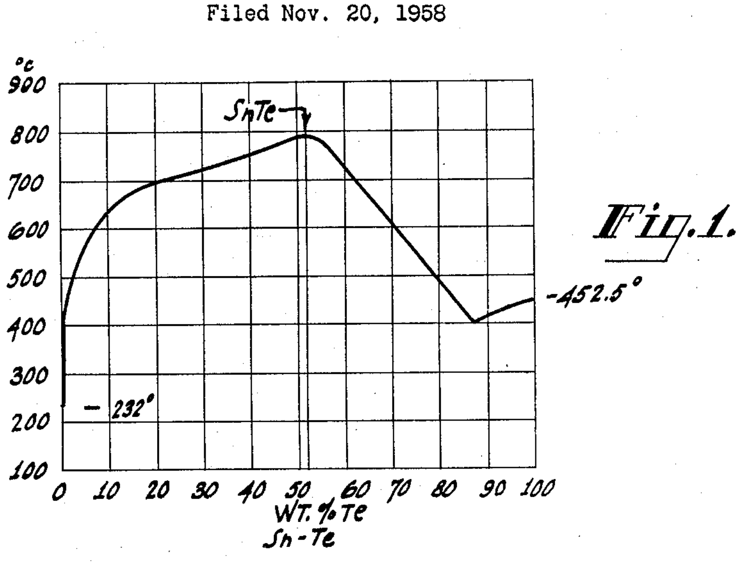

The invention and its advantages will be described in greater detail with reference to the accompanying drawing, in which:

Figure 1 is a phase diagram of the tin tellurium system.

Figures 2*a*–2*d* are cross-sectional schematic views of successive steps in the fabrication of a diode having the features hereinbefore mentioned.

Figures 3*a*–3*e* are cross-sectional schematic views of successive steps in the fabrication of a transistor according to another embodiment of the invention.

Similar reference characters are applied to similar elements throughout the drawing.

A phase diagram of the tin tellurium system is shown in Figure 1. It will be seen that the composition which has the highest melting point (about 790° C.) corresponds to the formation of tin telluride, and contains about 52 weight percent tellurium. Stoichiometric tin telluride contains 51.8 percent by weight tellurium. It will also be noted that the melting point of mixtures of tin telluride with either excess tin or excess tellurium remains above 600° C. for a wide range of compositions, from 10 weight percent to 70 weight percent tellurium. However, mixtures of tin telluride with excess tellurium are not ductile and have poor mechanical qualities, whereas the addition of excess tin to tin telluride improves the ductility and mechanical properties of the material. The amount of excess tin used may vary from a few weight percent up to a mixture containing 3 mols of tin for each mol of tin telluride. It has been found that a mixture of tin telluride and tin which contains about 20 percent by weight tellurium and melts at about 700° C. has good electrical properties and forms mechanically strong junctions. The mixture may be regarded as consisting of about 40 weight percent tin telluride and 60 weight percent tin.

Figure 2:
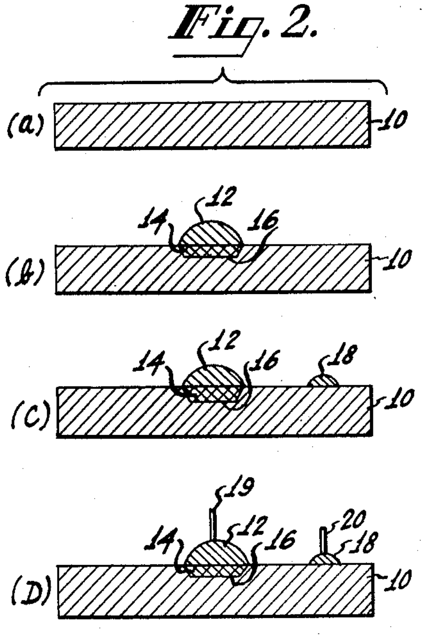
Figure 3:
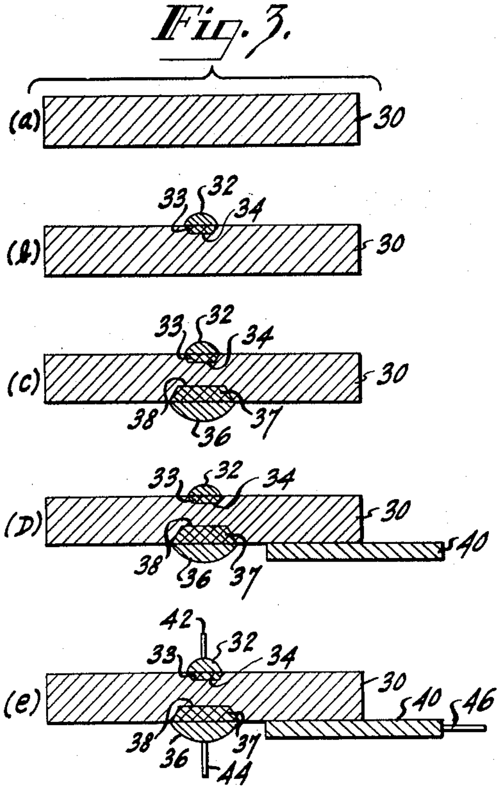

The construction of a diode in accordance with the invention is depicted in Figure 2. As shown in Figure 2*a* of the drawing, a semiconductor body is prepared as a wafer 10 of a monocrystalline semiconductive III–V compound selected from the phosphides, arsenides and antimonides of aluminum, gallium and indium. The semiconductor body 10 should be of P-conductivity type. In this example, the wafer material used is P-conductivity type indium phosphide. The exact size of the wafer 10 is not critical. A suitable wafer may be about 100 mils square and about 10 mils thick.

Referring to Figure 2*b*, a rectifying electrode is made by alloying to one face of the wafer 10 an electrode pellet 12 of material selected from the group consisting of tin telluride and mixtures of tin telluride with tin. In this example, the electrode pellet 12 consists of tin telluride. The shape of the pellet 12 is not critical, and may be a small disc, a ring, or a spherule known as a dot. The pellet 12 is alloyed or fused to one face of the wafer 10 by contacting the pellet to the wafer and heating the assembly to a temperature above the melting point of the electrode pellet but below the melting point of the semiconductor wafer. Tin telluride melts at about 790° C., while indium phosphide melts at about 1050° C. It has been found that good results may be obtained by alloying within the temperature range of a few degrees above the melting point of the electrode pellet to a few degrees below the melting point of the semiconductor wafer. Alloying in fact takes place even at the melting point of tin telluride. For best results, the heating step should be performed in a non-oxidizing or reducing ambient such as hydrogen or forming gas. In this example, the assembly of electrode pellet 12 and wafer 10 is heated in a hydrogen atmosphere for about 10 minutes at about 800° C. The pellet 12 melts and dissolves the portion 14 of the wafer which is adjacent and just below the pellet. When the assembly is cooled, the wafer portion 14 recrystallizes, but contains sufficient tellurium so as to be converted to N-conductivity type. At the interface 16 between the N-type region 14 and the P-type bulk of the wafer 10, a rectifying barrier 16 known as a PN junction is formed. The contact thus formed between the tin telluride pellet 12 and the P-type indium phosphide wafer 10 is mechanically strong, even when the surface of the indium phosphide is relatively dirty. The surface of the wafer 10 may then be cleaned by immersing the wafer in an etchant. A suitable etchant for the semiconductive III–V compound is composed of equal volumes of concentrated nitric acid and concentrated hydrochloric acid.

Referring to Figure 2*c*, a non-rectifying or ohmic electrode is fabricated by alloying or fusing to a surface of the wafer 10 a pellet 18 of material such as zinc or cadmium. In this example, the pellet 18 consists of cadmium. The pellet or dot 18 is alloyed to one face of the wafer by contacting the dot 18 to the wafer 10 and heating the assembly to about 500° C. for about 20 minutes. Preferably, the heating is performed in a reducing atmosphere such as hydrogen, to avoid oxidation of the materials. The contact between the pellet 18 and the P-type wafer 10 is ohmic or non-rectifying in character.

Referring to Figure 2*d*, the device is completed by attaching electrical leads 19 and 20 to the rectifying electrode 12 and the ohmic electrode 18 respectively. The unit is subsequently mounted and cased by conventional means known in the art.

The resulting diodes have the advantage of operating successfully at higher temperatures than comparable prior art units using germanium or silicon as the semiconductive material. Semiconductor devices are limited as to operating temperatures because high temperatures impart sufficient energy to the semiconductor to raise substantial numbers of electrons across the energy gap between the valence band and the conduction band, thus adversely affecting the performance parameters of the unit. The greater the energy gap of the semiconductor used, the higher the temperature at which the device can operate, provided the electrodes of the device remain operative. However, if the energy gap of a semiconductor becomes too large, the material becomes similar to an insulator in its properties, and is not practical for devices such as transistors. The energy gap of germanium is about 0.7 electron volt, and most germanium semiconductive devices become inoperative above 80° C. Silicon semiconductive devices can be successfully operated at higher ambient or dissipation temperatures, as silicon has an energy gap estimated at about 1.1 electron volts. The III–V compounds mentioned above are useful because they have energy gaps greater than that of germanium or silicon but still within the range of usefulness of a semiconductor. Indium phosphide, which has been mentioned as a representative III–V compound, has an energy gap of 1.25 electron volts. Devices of this class using indium phosphide as the semiconductor can be operated at temperatures as high as 300° C. It has been found that rectifying contacts made in accordance with the invention as described above remain satisfactory throughout the temperature range from room temperature to 300° C.

In addition to diodes, other devices such as improved triodes of the transistor type may be made by the method of this invention. Such devices contain two rectifying electrodes fused or alloyed to opposite surfaces of a semiconductive wafer. Referring to Figure 3*a*, a semiconductor body 30 is prepared as a wafer of a monocrystalline semiconductive compound selected from the group consisting of the phosphides, arsenides and antimonides of aluminum, gallium and indium. The wafer is of P-conductivity type, and has two substantially parallel opposite surfaces. In this example, the material used is P-conductivity type gallium arsenide. The exact size of the wafer is not critical, and may be similar to that of the diode described in connection with Figure 2.

Referring to Figure 3*b*, a rectifying electrode is made by alloying to one major face of the wafer a pellet 32 of material selected from the group consisting of tin telluride and mixtures of tin telluride with tin. In this example, the electrode 32 consists of a mixture which contains 40 percent by weight tin telluride, balance tin, and melts at about 700° C. The composition may be alternatively expressed as a mixture of tin and tellurium containing 20 weight percent tellurium. The pellet 32 is fused to one major face of the wafer 30 by contacting the pellet to the wafer and heating the assembly to about 800° C. for about 15 minutes. The alloying step is preferably performed in a reducing atmosphere such as forming gas or hydrogen. The electrode pellet 32 melts and dissolves a region 33 of the wafer immediately adjacent the pellet. When the assembly is cooled to room temperature, the region 33 recrystallizes and is converted to N-conductivity type. A rectifying barrier 34 is formed at the interface of the N-type region 33 and the P-type bulk of the wafer 30.

Referring to Figure 3*c*, a second rectifying barrier is formed in the wafer 30 by similarly alloying another tin telluride-tin electrode pellet 36 to the opposite major face of the wafer 30. The pellet 36 is preferably coaxially aligned with the first electrode 32. In surface alloyed transistors of the class shown, having two electrodes aligned on opposite sides of a semiconductive wafer, it has been found advantageous to make one electrode larger than the other, and utilize the smaller electrode as the emitter while the larger electrode is made the collector. In this example, the second electrode pellet 36 is larger than the first electrode pellet 32. The wafer region 37 is converted on recrystallization to N-conductivity type. A PN junction 38 is formed at the interface of the N-type region 37 and the P-type bulk of the wafer 30.

Referring to Figure 3*d*, a base tab 40 is soldered to a surface of the wafer 30. The connection between the base tab 40 and the gallium arsenide wafer 30 must be ohmic in character. The base tab 40 may be made of nickel, or nickel alloys such as fernico, or kovar. In this example, the base tab 40 consists of nickel, and is soldered to the gallium arsenide wafer 30 with cadmium. Cadmium acts as an ohmic high melting point solder between the base tab 40 and the P-conductivity type wafer 30. Pure tin or ordinary solder cannot be used in devices intended to operate at elevated temperatures, since tin melts at 231° C.

Referring to Figure 3*e*, the transistor is completed by cleaning the wafer surface in the etchant described above, and then attaching leads 42, 44 and 46 to the emitter 32, the collector 36, and the base tab 40 respectively.

Although the above embodiments of the invention have been described in terms of indium phosphide and gallium arsenide as the semiconductive material, it will be understood that these materials have been mentioned as representative examples of the compounds which may be used, and not as a limitation. The invention may be practiced with all the other III–V compounds, such as gallium phosphide, aluminum arsenide and aluminum antimonide. Other semiconductive devices may be made by the method of this invention from these materials, each device having at least two regions of opposite conductivity type separated by a PN junction or rectifying barrier, and including at least one rectifying electrode selected from the group consisting of tin telluride and mixtures of tin telluride with tin.

As mentioned above, the devices made in accordance with the instant invention may be successfully operated at ambient temperatures considerably higher than the limiting operating temperatures for germanium and silicon units. Rectifying electrodes made of tin telluride or tin telluride-tin mixtures in accordance with the instant invention may be employed for devices intended to operate up to about 300° C. The tellurides of indium, gallium and lead may also be employed, but they are not as satisfactory as tin telluride.

Devices of the type described above have other advantages besides the ability to operate at elevated temperatures. See a review article by Dietrich A. Jenny, entitled "The Status of Transistor Research in Compound Semiconductors," page 959, June 1958, Proc. IRE. For example, an important semiconductor parameter is the mobility of charge carriers in the material. High mobility is particularly desirable in the charge carriers in devices such as transistors. The mobility of negative charge carriers (electrons) in germanium is about 3900 $cm.^2$/volt sec. The mobility of electrons in silicon is smaller, being about 1500 $cm.^2$/volt sec. Some of the III–V compounds mentioned above have considerably higher mobilities. For example, the mobility of electrons in indium phosphide is at least 3500 $cm.^2$/volt sec; in indium arsenide, about 23,000 $cm.^2$/volt sec; in indium antimonide, about 65,000 $cm.^2$/volt sec. Gallium arsenide, which has been mentioned above as a representative example of the III–V compound semiconductors, has an electron mobility of at least 4500 $cm.^2$/volt sec, and thus unites the advantages of a charge carrier mobility greater than that of germanium with the advantage of an energy gap greater than that of silicon. Semiconductors with high electron mobility are particularly suitable for NPN devices of the type described in connection with Figure 3.

There have thus been described new and useful forms of semiconductor devices, as well as methods for making these devices.

What is claimed is:

1. A circuit element comprising a body of a P-conductivity type semiconductive III–V compound, said element having at least one rectifying electrode fused to said body, said electrode comprising a member of the group consisting of tin telluride and mixtures of tin telluride with tin.

2. A circuit element comprising a P-conductivity type semiconductive body of material selected from the group consisting of the phosphides, arsenides and antimonides of aluminum, gallium and indium, said element having at least one rectifying electrode alloyed to asid body, said electrode comprising a member of the group consisting of tin telluride and mixtures of tin telluride with tin.

3. A junction semiconductor device comprising a P-conductivity type semiconductive body of material selected from the group consisting of the phosphides, arsenides and antimonides of aluminum, gallium and indium, said device having two rectifying electrodes alloyed to opposite faces of said body and one ohmic electrode alloyed to said body, said rectifying electrodes comprising a member of the group consisting of tin telluride and mixtures of tin telluride with tin.

4. A junction type semiconductor device including a semiconductive compound wafer selected from the phosphides, arsenides and antimonides of aluminum, gallium and indium, said wafer containing at least one rectifying barrier between a P-conductivity type region and an N-conductivity type region, and at least one rectifying contact to said wafer, said contact comprising a surface alloyed pellet of material selected from the group consisting of tin telluride and mixtures of tin telluride with tin.

5. A semiconductor device including a rectifying electrode composed of a member of the group consisting of tin telluride and mixtures of tin telluride with tin, said electrode being fused to a body of P-type semiconductive material selected from the group consisting of the phosphides, arsenides and antimonides of aluminum, gallium and indium.

6. In the method semiconductor devices comprising the steps of forming at least one rectifying barrier in a wafer of semiconductive material selected from the group consisting of the phosphides, arsenides and antimonides of aluminum, gallium and indium, the improvement comprising fabricating said rectifying barrier by alloying to the surface of a P-conductivity type portion of said wafer a pellet of material selected from the group consisting of tin telluride and mixtures of tin telluride with tin.

7. The method of making rectifying contacts to P-conductivity type bodies of binary semiconductive compounds selected from the group consisting of the phosphides, arsenides, and antimonides of aluminum, gallium and indium, comprising contacting said body with a quantity of electrode material selected from the group consisting of tin telluride and mixtures of tin telluride with tin, and heating said body and electrode material in a non-oxidizing atmosphere to a temperature above the melting point of said electrode material but below the melting point of said semiconductive compound.

8. In the method of making a transistor comprising the steps of alloying two rectifying electrode pellets into opposite faces of a wafer of P-conductivity type semiconductive material selected from the group consisting of the phosphides, arsenides and antimonides of aluminum, gallium and indium, the improvement comprising utilizing as electrode material a substance selected from the group consisting of tin telluride and mixtures of tin telluride with tin.

9. A method of making an electrical device comprising alloying at least one rectifying electrode with a portion of a body of P-conductivity type semiconductive gallium arsenide, said electrode being composed of a material selected from the group consisting of tin telluride and mixtures of tin telluride with tin.

10. A circuit element comprising a wafer of P-conductivity type semiconductive material, said material being selected from the group consisting of the phosphides, arsenides and antimonides of aluminum, gallium and indium, an ohmic electrode fused to the surface of said wafer, and at least one rectifying electrode alloyed to one face of said wafer, said rectifying electrode being composed of a material selected from the group consisting of tin telluride and mixtures of tin telluride with tin.

11. A circuit element comprising a monocrystalline wafer of P-conductivity type semiconductive indium phosphide, a non-rectifying electrode alloyed to the surface of said wafer, and at least one rectifying electrode alloyed to one face of said wafer, said rectifying electrode being composed of a material selected from the group consisting of tin telluride and mixtures of tin telluride with tin.

12. A semiconductor device comprising a body of P-conductivity type semiconductive material having two rectifying electrodes alloyed to opposite surfaces, said semiconductive material being selected from the group consisting of the phosphides, arsenides and antimonides of aluminum, gallium and indium, said rectifying electrodes being coaxially aligned pellets composed of a material selected from the group consisting of tin telluride and mixtures of tin telluride with tin.

13. The method of making an NPN transistor comprising the steps of alloying electrode pellets into opposite faces of a wafer of P-type semiconductive material so that two separate rectifying barriers are formed within said wafer, said wafer comprising a compound selected from the group consisting of the phosphides, arsenides and antimonides of aluminum, gallium, and indium, said pellets being of material selected from the group consisting of tin telluride and mixtures of tin telluride with tin.

14. A method of making an electrical device comprising alloying an electrode pellet with a portion of a body of P-type semiconductive material so as to form a region of N-type conductivity separated from the remainder of said body by a PN junction, said wafer comprising a compound selected from the group consisting of the phosphides, arsenides and antimonides of aluminum, gallium and indium, said electrode pellet being composed of material selected from the group consisiting of tin telluride and mixtures of tin telluride with tin.

15. A method of making an electrical device comprising surface alloying an electrode material to a wafer of P-conductivity type semiconductive material by heating said electrode material in contact with a surface of said wafer to a temperature above the melting point of said electrode material but below the melting point of said semiconductive material, said electrode material being selected from the group consisting of tin telluride and mixtures of tin telluride with tin, said semiconductive material being selected from the group consisting of the phosphides, arsenides and antimonides of aluminum, gallium and indium.

16. A semiconductor device comprising a body of P-conductivity type semiconductive material having two substantially parallel opposite surfaces and two rectifying electrodes, one electrode being alloyed into one of said surfaces and the other of said electrodes being alloyed into the other of said surface, said material being selected from the group consisting of the phosphides, arsenides and antimonides of aluminum, gallium and indium, said two electrodes being coaxially aligned and consisting essentially of a material selected from the group consisting of tin telluride and mixtures of tin telluride with tin.

17. A method of making a circuit element comprising alloying an electrode material to a wafer of monocrystalline P-conductivity type semiconductive material selected from the phosphides, arsenides and antimonides of aluminum, gallium and indium, said alloying being performed by heating a quantity of said electrode material in contact with a surface of said wafer in a reducing ambient to a temperature above the melting point of said electrode material but below the melting point of said semiconductive material, said electrode material being selected from the group consisting of tin telluride and mixtures of tin telluride with tin.

References Cited in the file of this patent

UNITED STATES PATENTS

| | | |
|---|---|---|
| 2,829,422 | Fuller | Apr. 8, 1958 |
| 2,842,831 | Pfann | July 15, 1958 |
| 2,862,160 | Ross | Nov. 25, 1958 |
| 2,866,140 | Jones et al. | Dec. 23, 1958 |